US006813152B2

United States Patent
Perazzo (10) Patent No.: US 6,813,152 B2
(45) Date of Patent: Nov. 2, 2004

(54) METHOD FOR IMPROVING AIRFLOW IN SUBRACK MECHANICS BY USING A HYBRID SERIAL/PARALLEL FAN CONFIGURATION

(75) Inventor: Thomas M. Perazzo, Solana Beach, CA (US)

(73) Assignee: APW Ltd., Waukesha, WI (US)

( * ) Notice: Subject to any disclaimer, the term of this patent is extended or adjusted under 35 U.S.C. 154(b) by 126 days.

(21) Appl. No.: 10/345,800

(22) Filed: Jan. 16, 2003

(65) Prior Publication Data

US 2003/0214785 A1 Nov. 20, 2003

Related U.S. Application Data

(60) Provisional application No. 60/349,814, filed on Jan. 18, 2002.

(51) Int. Cl.[7] ................................................ H05H 7/20
(52) U.S. Cl. ....................... 361/695; 165/80.3; 165/121; 361/715; 415/213.1; 417/360; 417/423.5; 454/184
(58) Field of Search ................................ 165/80.3, 121, 165/122; 361/687, 694–695, 715; 415/176–178, 213.1, 214.1; 417/360, 423.14, 423.15, 423.5, 423.7

(56) References Cited

U.S. PATENT DOCUMENTS

| 5,949,646 A | * | 9/1999 | Lee et al. ..................... 361/695 |
| 6,042,474 A | * | 3/2000 | Harvey et al. ............... 454/184 |
| 6,239,971 B1 | * | 5/2001 | Yu et al. ...................... 361/695 |
| 6,252,770 B1 | * | 6/2001 | Yu et al. ...................... 361/695 |
| 6,592,448 B1 | * | 7/2003 | Williams ..................... 454/184 |

FOREIGN PATENT DOCUMENTS

| WO | WO 94/22285 | * | 9/1994 | ................. 361/695 |

* cited by examiner

Primary Examiner—Gregory D. Thompson
(74) Attorney, Agent, or Firm—Quarles & Brady LLP (57) ABSTRACT

Disclosed is an improved fan module for use in an electronic enclosure. The fans are arranged in a hybrid serial parallel configuration which provides both redundant flow of successive fans and the ability to flow around a failed or locked fan to continue airflow. The fans are further arranged in an angled configuration to provide airflow through the enclosure without the need for baffles or other thermodynamic steering devices.

19 Claims, 5 Drawing Sheets

METHOD FOR IMPROVING AIRFLOW IN SUBRACK MECHANICS BY USING A HYBRID SERIAL/PARALLEL FAN CONFIGURATION

CROSS-REFERENCE TO RELATED APPLICATION

This application claims priority to U.S. application No. 60/349,814, filed Jan. 18, 2002.

STATEMENT REGARDING FEDERALLY SPONSORED RESEARCH OR DEVELOPMENT

Not applicable.

FIELD OF THE INVENTION

This invention relates generally to electronic systems that include cabinets, racks, subracks and plug-in modules with printed circuit boards for insertion and removal from said rack or cabinets. Specifically, the invention relates to a method of cooling the electronic components in the subrack to provide high performance and fault tolerance.

BACKGROUND OF THE INVENTION

Cabinets, enclosures, subracks or card cages ("subracks") are enclosures for electronics which provide a precise framework in which printed circuit boards are supported and guided into connector positions, typically using accurate extrusion technology and hard-tooled end plate design. The subrack not only supports the printed circuit board and related electronic components, but can further provide additional functions such as RFI protection, shock and vibration protection, ESD protection and fire enclosure safety for the electronics of a system.

Subracks are useful in electronic structures because they allow a user to configure usable storage space to suit the application, thus removing the necessity to "tool" each configuration as a custom solution. Configuration features such as "divider kits" allow a user to provide a variety of heights, widths and depths within a single enclosure size. The frame systems employed in subracks further allow the user to select the orientation of the printed circuit boards from a vertical to a horizontal configuration, or to select a combination of the two within the same frame.

Because subracks provide a wide array of electronics within a relatively small space, subracks must be cooled in order to prevent the electronics from overheating. Typically, fan modules and trays are provided in or on the subrack to provide this function. Conventional fan modules or fan trays utilize axial fans or motorized impellers/blowers to move air axially across the top and/or bottom of the printed circuit boards mounted in the subrack. While these devices provide a relatively effective method for cooling the rack, there are a number of problems associated with typical fan configurations.

Figure 1:
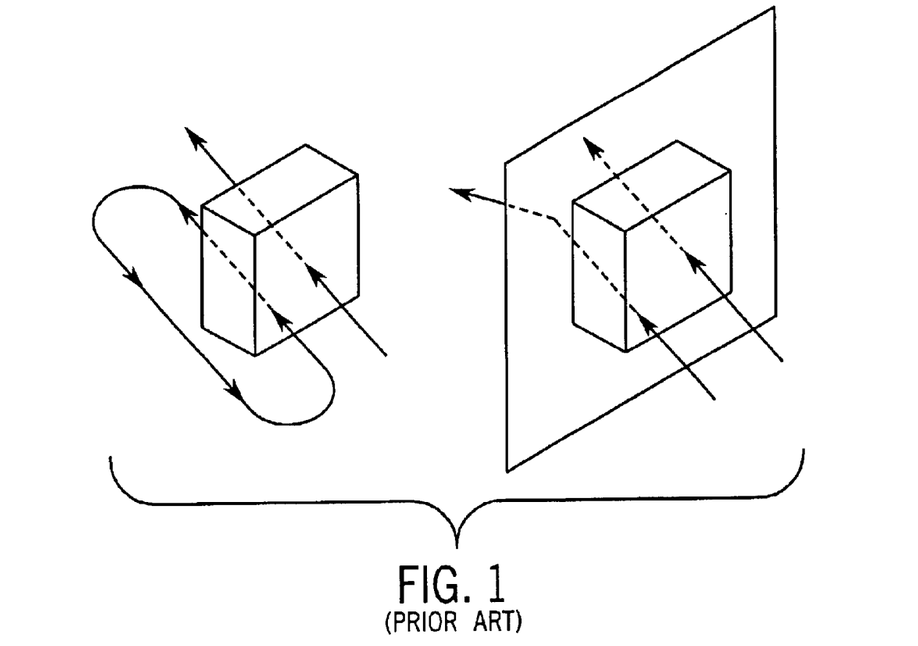
FIG. 1 is a perspective view of a prior art fan module illustrating re-circulation of air through a fan and the use of a baffle to limit re-circulation.
Figure 2:
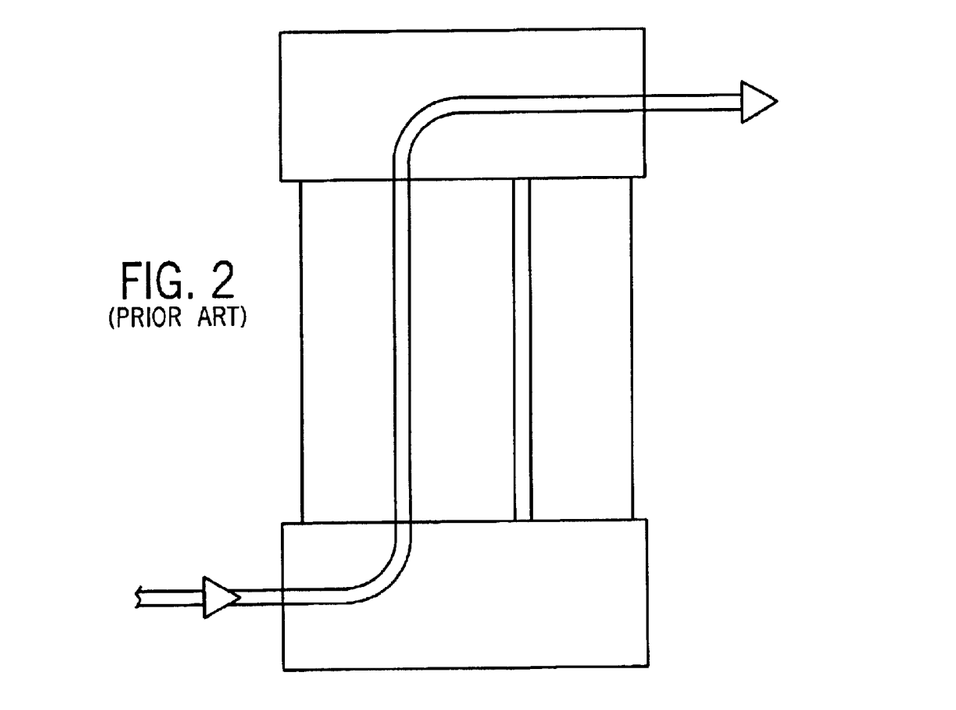
FIG. 2 is a cutaway view of a prior art electronics enclosure illustrating an S-shaped pattern of air flow through the enclosure.

For example, a typical fan configuration requires that a baffle be provided around the outside of the fan to avoid recirculation of the air, as shown in FIG. 1. These baffles require a great deal of non-value added space, typically at a premium in a subrack system. Furthermore, most prior art enclosure systems require air to intake in the front and exhaust in the rear, as shown in FIG. 2. This requirement forces air to flow in a S-shaped pattern making 90 degree bends from the bottom to the top, and thermodynamic work is therefore spent to change the direction of airflow. In all cases, irreversible airflow losses occur.

Additionally, problems arise when a fan or other air moving device located directly above or below a set of printed circuit cards fails. When the cooling system fails, the corresponding printed circuit boards or cards can fail in a matter of minutes due to the lack of air movement and because of overheating.

To prevent overheating and failure, one known approach is to provide air coolant redundancy by using a serial or "push-pull" fan configuration. In a push-pull configuration, a first set of fans pushes air into the subrack and a second set of fans pulls air from the subrack. In the event that one fan or set of fans fails, therefore, a second set of fans provides air flow through the rack. The push-pull fan system therefore provides a useful means for cooling subracks. However, push-pull systems also have a number of disadvantages. First, when either the push or the pull fan fails, the failed fan provides an impedance to airflow in the direct path of the opposing fan, and air therefore tends to flow more efficiently through neighboring cards, rather than through the bank of printed circuit boards expected to be cooled by the fan. Furthermore, high flow rates are difficult to achieve with a push pull configuration because, when the fans are installed in series, the maximum volume of air is limited to that of a single fan.

A known alternative to the serial configuration is the parallel configuration. In the parallel configuration, fans are installed parallel or adjacent to each other. Fans installed in this way can provide twice the volume of air flow as a single fan. Parallel fans, however, do not provide the redundancy of push-pull configurations, and further require significant space, which can be problematic in small subrack enclosures.

Neither the serial nor the parallel configuration, furthermore, has been shown to be particularly effective in electronic systems which require a fault tolerant airflow scheme to insure no functionality is lost due to overheating. Mission critical systems and large electronic infrastructure systems, for example, cannot tolerate outages for more than a few seconds per year. In these systems, therefore, a maintenance technician is typically notified automatically when a single fault condition occurs. Despite these precautions, several hours if not days may go by, however, before a fan module can be replaced. In order to meet the expected level of reliability, the cooling system is expected to maintain sufficient air flow through the system until the system can be repaired.

A complete backup airflow system is not practical given the expensive space it would need to occupy and the additional cost of supplying two cooling systems. There remains a need, therefore, for a fault tolerant airflow system which can provide sufficient air flow to allow a system to operate indefinitely with a single fan failure, and further, which is compact and provides sufficient airflow with a high degree of efficiency.

SUMMARY OF THE INVENTION

An object of the present invention is to provide a cooling system that is inherently fault tolerant and also highly efficient without the need for fan speed control. The present invention provides a fan module for use in an electronic cabinet, rack or subrack which provides increased air flow as compared to typical prior art fan modules, and assures continuous air flow even when one or more fans has failed. In one aspect of the invention, the fan module comprises a plurality of fans which are successively spaced along a first Cartesian coordinate (i.e. the z direction) and which are staggered or offset along a second (x) and/or third (y) Cartesian coordinate. The offset or staggering of the fans lowers the impedance to airflow through the module in the event of the failure of one or more fans, thereby allowing air flow to continue in the event of a failure. The offset or staggering also provides a consistent air flow through the module, thereby limiting the tendency of air to circle back and re-circulate through a given fan, and minimizing or preventing the need for a baffle around each fan.

In another aspect of the invention, successive fans in the fan module are angled at a successively greater degree above the z direction to direct the air flow through the fan module. The fans can be angled to provide an air flow at any selected angle, where the selected angle depends on the relative positions of the air intake and exhaust for the fan module. For example, an air intake is positioned in a bottom panel of the fan module and an exhaust is located in a side panel of the module. The fans in the module are successively angled between zero and ninety degrees to filly direct air flow from the intake to the exhaust. In this application, the fan closest to the intake is at or near a zero degree angle, while the fan closest to the intake panel is at or near a ninety degree angle. Each of the fans in between are spaced at successively larger angles between zero and ninety degrees. Because the fans are angled rather than directed specifically at one side of the fan module, a number of the fans can be directed at the intake area. For example, the fans can be arranged such that the first and second fans can each draw air through the intake panel. Consequently, a larger intake area can be provided, thereby increasing total air flow through the fan module. Although the fan module has been shown and described for directing air flow at a ninety degree angle, other configurations can also be provided. One typical application provides an intake and an exhaust which are offset by one hundred and eighty degrees.

Preferably, the exhaust of the fan module comprises a metallic honeycomb panel or other cellular, geometric structure capable of allowing sufficient air flow through the structure, but limiting electromagnetic interference by providing a wave guide. In a preferred embodiment, the fan module of the present invention is located on top of a subrack including a card cage. The bends and corners in the subrack enclosure and card cage are constructed with a bend radius greater than the typical ninety degree corner. The larger bend radius minimizes impedance losses to the air flow and therefore maximizes air flow around the corners.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE PREFERRED EMBODIMENTS

Figure 3:
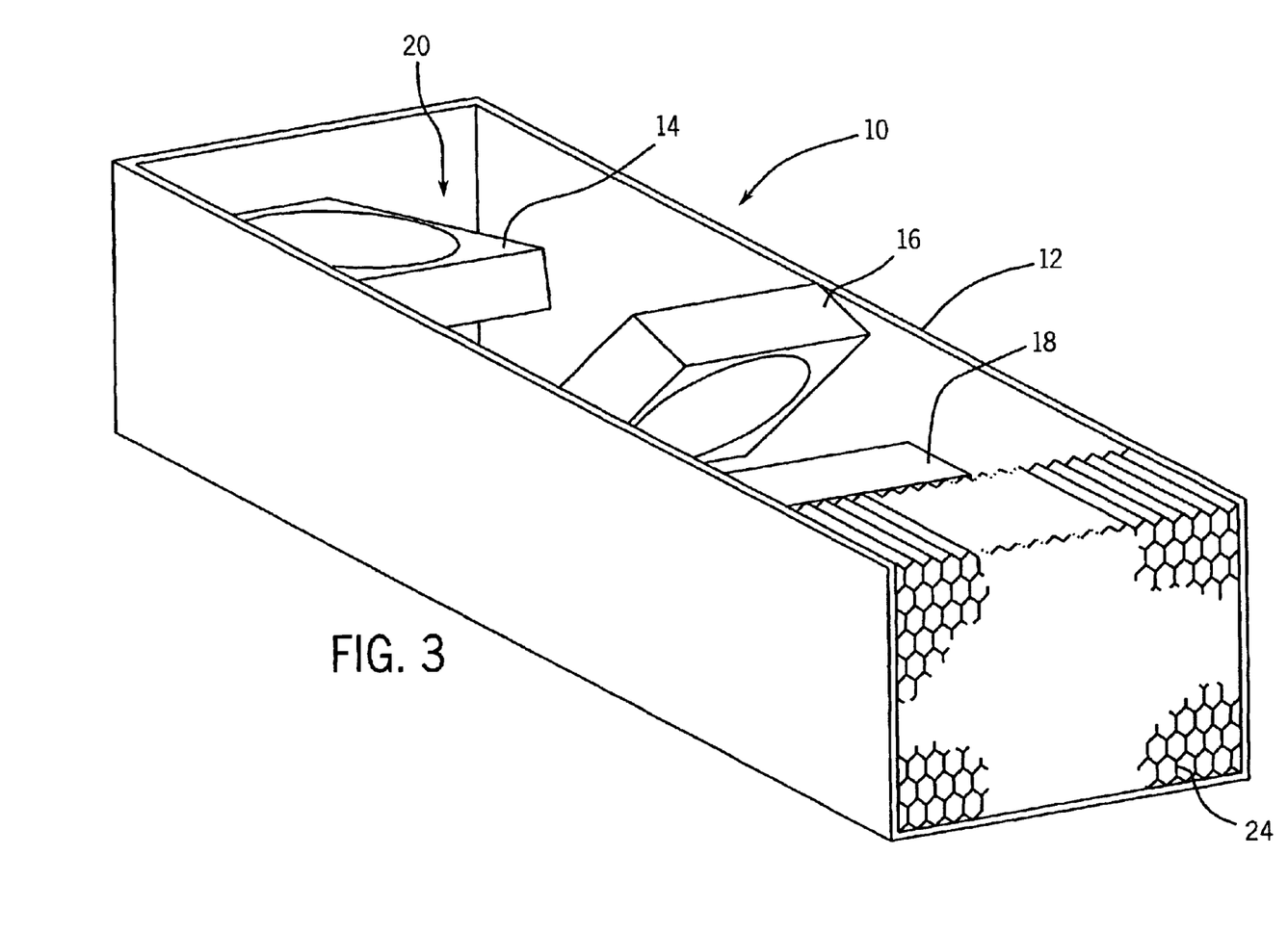
FIG. 3 is a perspective view of a fan module constructed in accordance with the present invention, with the top removed to illustrate the fans inside.

Referring now to the figures and more particularly to FIG. 3, a perspective view of a fan module 10 constructed in accordance with the present invention is shown. The fan module 10 comprises a housing or enclosure 12 in which fans 14, 16, and 18 are arranged. Air is provided through an intake 20 at the bottom of the fan module 10 and is directed through an exhaust panel 24 located at an end of the fan module housing, 90 degrees from the intake 20. The fans 14, 16, and 18 are staggered or offset in at least one Carlesian coordinate to allow a portion of the airflow from each fan 14, 16, and 18 to proceed through successive fan 14, 16, and 18 while another portion of the airflow flows around the successive fan 14, 16, and 18. Therefore, if any of the fans fail, air can continue to be pushed or pulled through the empty space created by the staggered fan arrangement and can further bypass the failed fan without the high airflow impedance associated with a locked fan. High airflow is also achieved because airflow from successive fans is partially additive or redundant in the fan module 10. Although the invention is described with reference to three fans 14, 16, and 18, a hybrid or staggered approach employed in the present invention can be used for two or more fans.

Figures 4, 5:
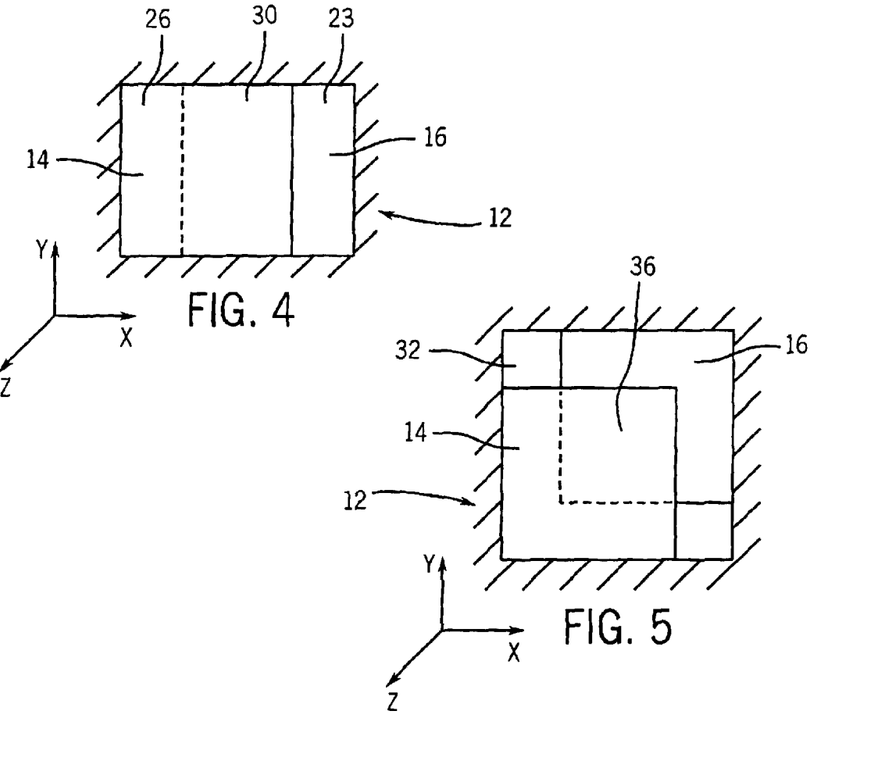
FIG. 4 is a cutaway plan view of the front of a fan module illustrating two fans staggered in one Cartesian coordinate.
FIG. 5 is a cutaway plan view of the front of a fan module illustrating two fans staggered in two Cartesian coordinates.

Referring now to FIG. 4 a front plan view of the fan module 10 of FIG. 3 is shown illustrating the staggering of fans 14 and 16. Fans 14 and 16 are provided in the module housing 12 spaced apart or offset in the z-direction (see FIG. 4). Fan 16 is further offset from the fan 14 in the x direction thereby providing an open area 26 behind fan 14, through which airflow fan 14 can continue in the event of the failure of fan 16. Similarly, an open area 23 is provided in front of fan 16, through which air can be pulled in the event of the failure of fan 14. Redundant airflow, in which airflow is additive from the two fans 14 and 16, is provided through the overlapped area 30 between the fans 14 and 16.

Referring now to FIG. 5 an alternate embodiment for staggering the fans 14 and 16 is shown. Here the fans 14 and 16 are offset in the z direction (FIG. 4) and are staggered in both the x and y direction resulting in a substantially L-shaped open area 32 behind the fan 14, and a substantially L-shaped open area in front of fan 16. Here a redundant airflow area 36 is provided at the approximate center of the housing 12. This arrangement provides a lower redundant airflow area than the arrangement shown in FIG. 4, but provides greater open airflow space around each of the fans, thereby providing a higher degree of airflow in the event that one of the fans become "locked" or fails.

Figure 6:
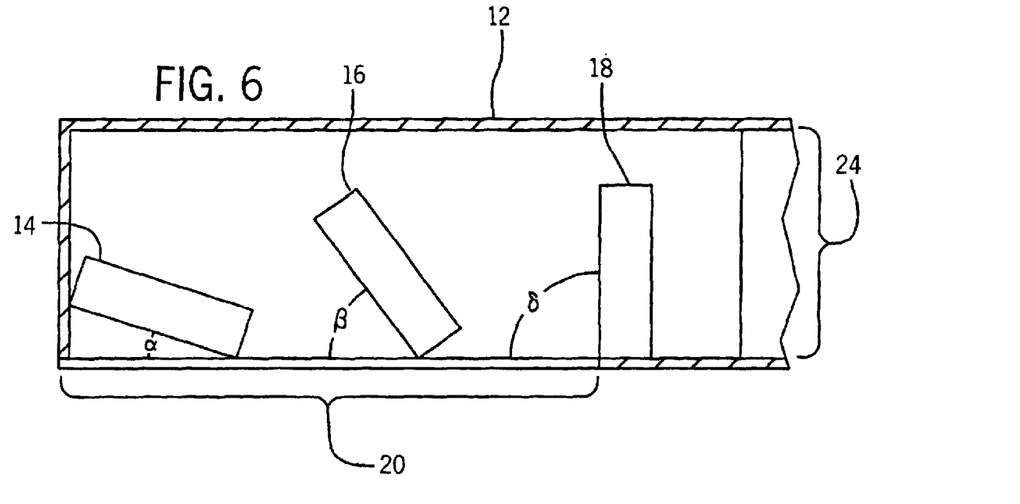
FIG. 6 is a cutaway side view of the fan module of FIG. 3.

Referring now to FIG. 6 a cutaway side view of the fan module 10 is shown. Here the air intake 20 is provided at the bottom of the fan module 10, as shown in FIG. 3, and is exhausted through the exhaust panel 24 located on a side of the housing 12 of the fan module 10 provided at an angle of ninety degrees from the intake 20. High efficiency is provided by this fan arrangement because the air intake 20 is provided over the entire bottom of the fan module whereas in conventional fan modules, the intake is typically limited to the cross-sectional area of one fan.

Referring still to FIG. 6, the fans 14, 16, and 18 are provided at successive angles between 0 and 90 degrees to direct the airflow in a 90 degree bend from the intake 20 to the exhaust plate 24 without the need for further dynamic steering devices such as baffles. As shown, the first fan 14 is provided at an angle alpha of approximately 15 degrees, the second fan 16 at an angle beta of about 45 degrees and the third fan 18 at an angle gamma of about 90 degrees. As the air is provided through the intake 20, it is directed by the successively angled fans through the exhaust at approximately a 90 degree angle such that the airflow is substantially perpendicular to the exhaust panel 24 as it exits the fan module 10. Although a specific arrangement is shown, the angle and location of each fan can be optimized for a given chassis layout. In particular, a fan arrangement can be provided to angle the flow of the air at any desired level between zero and one hundred and eighty degrees. In one preferred embodiment, the first fan 14 is provided at a fifteen degree angle while the fans 16 and 18 are at ninety degree angles.

Referring again to FIG. 3, the exhaust panel 24 is a low impedance exhaust panel 24 selected to maintain the momentum of airflow through the fan module 10 and therefore to minimize the tendency of the air to recirculate back through the fans 14, 16, and 18. To prevent such circulation, the exhaust panel 24 of the fan module 10 requires a large ratio of open air to structure which can be provided, for example, by a honeycomb plate structure as shown. The honeycomb structure is selected to have a size which prevents the insertion of fingers through the exhaust panel 24 while preventing or minimizing the distribution of electromagnetic interference from the module 10 by selecting the cell size such that a wave guide is provided below a cutoff condition for the system frequency limit. A honeycomb structure is preferred because typical honeycomb structures have an area ratio of greater than 98%. Other geometric shapes can also be used for the exhaust and are typically adequate as long as the area ratio is better than 90%.

Figure 7:
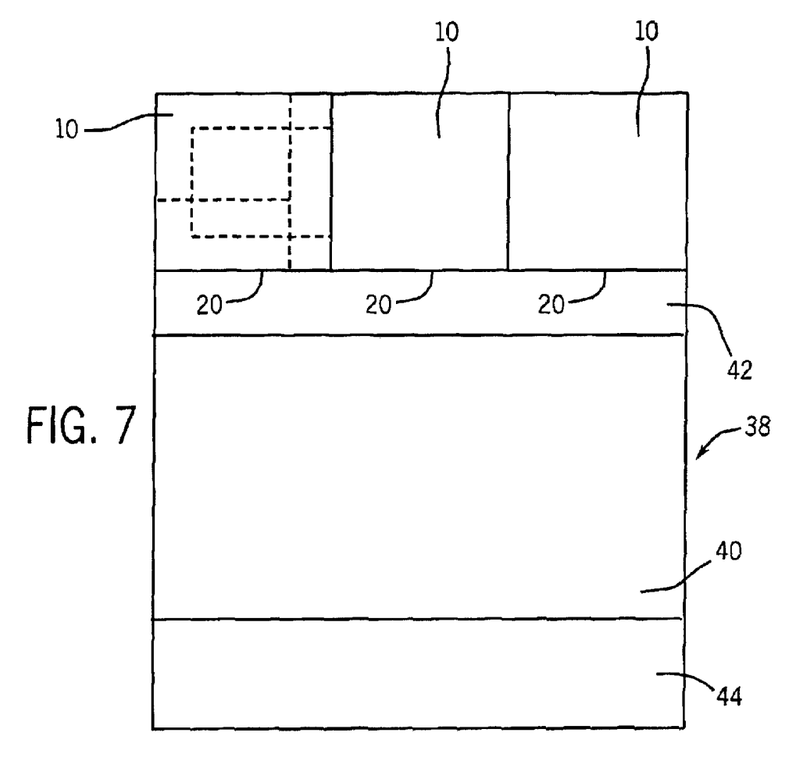
FIG. 7 is a plan view of an electronics enclosure constructed in accordance with the present invention.

Referring now to FIG. 7 a subrack 38 employing the fan module 10 of the present invention is shown. Here three fan modules 10 are provided above a card cage 40, wherein each of the fan modules 10 includes staggered fans as described above. The air intake 20 of the back of the fan module 10 faces the card cage 40. An air plenum 42 is provided between the card cage 40 and the fans 10, while a card cage air intake 44 is provided below the card cage 40. The location of the fan modules 10 is selected to be on top of the card cage 40 because, in this configuration, the air intake 20 of the fan module 10 experiences more uniform airflow, and because the backpressure of the fan module 10 is lower here because air can be exhausted directly to the ambient. Maintaining a low backpressure is important in minimizing or preventing recirculation of the air through the fan module 10. Although installation underneath the subrack is also possible, the flow impedance can reduce the efficiency of the module when provided in this position.

Figure 8:
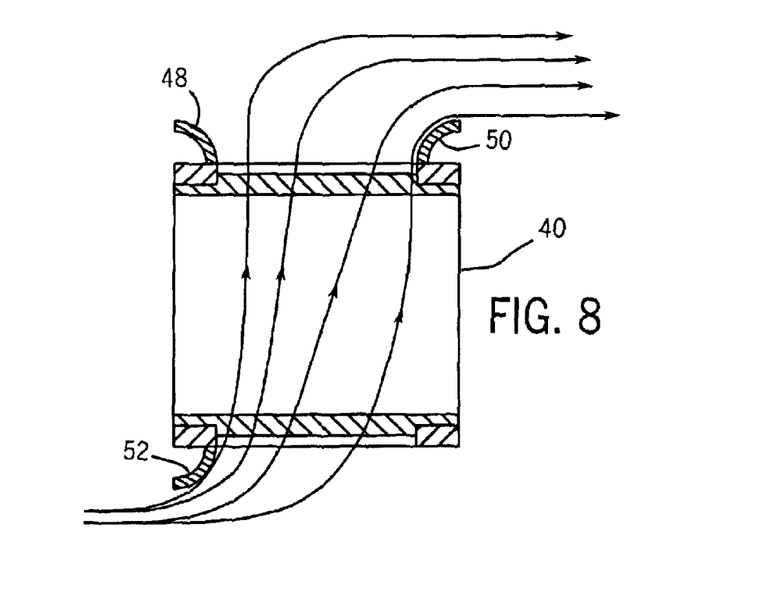
FIG. 8 is a cutaway view of the enclosure of FIG. 7, illustrating air flow through the enclosure.

Referring now to FIG. 8 a cross-sectional view of the card cage 40 of FIG. 7 is shown. The card cage 40 is preferably constructed to include corners which are bent such that the radius of curvature of the bend is greater than 90 degrees to improve airflow through the card cage 40. As shown, the corners are provided with curved baffles or involutes 48, 50, and 52 which limit sharp corners in the airflow path of the subrack of FIG. 5. Here the involutes 48, 50, and 52 limit turbulence and therefore lower the likelihood that the airflow will separate into eddy currents, and minimize airflow loss in the system. Since high airflow is desired for cooling efficiency, area changes, sharp corners, porous media and bends are preferably provided with large bend radii throughout the system to control airflow and minimize impedance losses.

To verify the efficiency of a fan module 10 constructed in accordance with the present invention, a fan module 10 was tested alone and then as part of an electronic enclosure. Each module tested measured 11.6" D×5.6" W×4.0" tall. Three Mechatronics G9232x fans were positioned in a housing 12 as shown in FIG. 5. The volumetric airflow was measured in accordance with AMCA 210-85. Air streamers were used to visualize where and in what direction the air was flowing. Hot wire anemometers were used to measure air velocity. The configuration yielded 115 cubic feet per minute (CFM) using these parameters.

Figure 9:
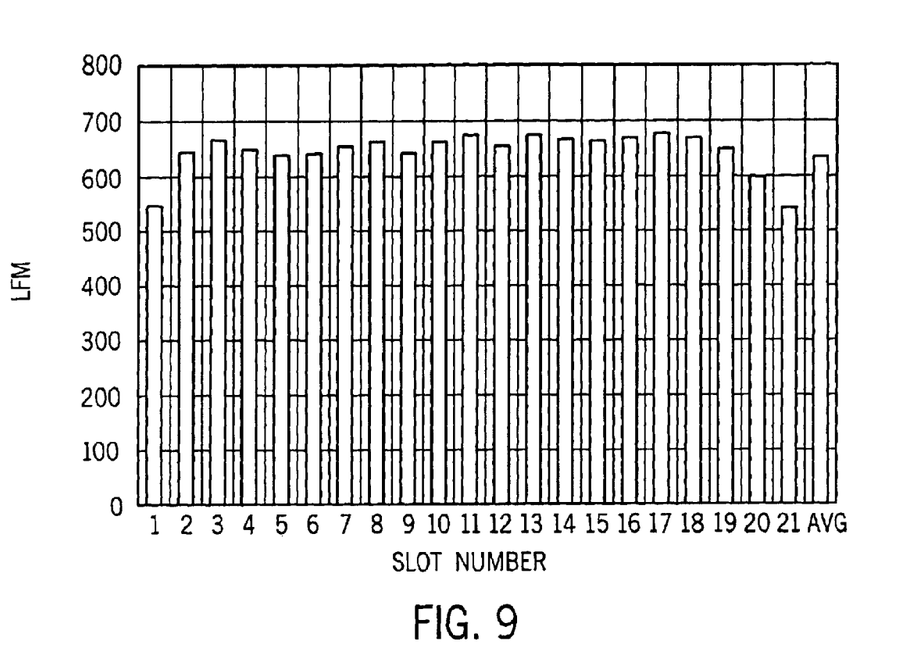
FIG. 9 is a chart illustrating air flow through a card enclosure employing the fan module of the present invention when all fans are working.
Figure 10:
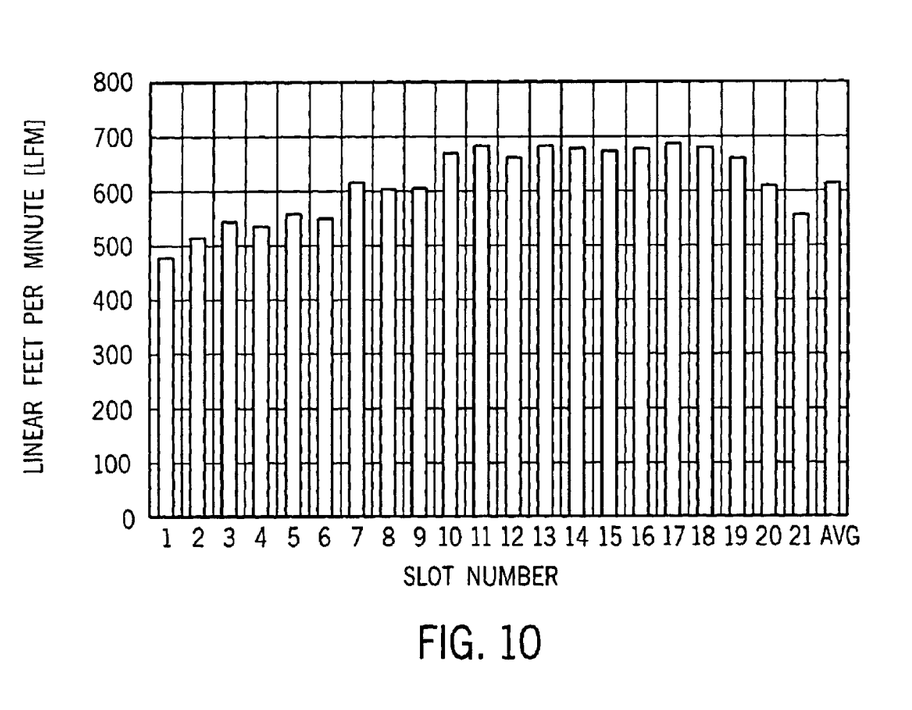
FIG. 10 is a chart illustrating air flow through a card enclosure employing the fan module of the present invention when one fan has failed.

In a test of the enclosure, three modules were installed in an enclosure measuring 19.25" H×11.6" D×17" W. Total airflow was measured at 295 CFM with all fans operating, and at 270 CFM with one fan in a locked or failed condition. Air velocity data for both an all fans active condition is shown in FIG. 9, and for a one fan failed condition is shown in FIG. 10, wherein air flow is illustrated versus a card slot number of a card cage.

These plots show that a 12% reduction in airflow resulted with no noticeable loss of performance. Fan speed control can be used to reduce the reduction in airflow if required. Acoustic measurements were also taken from the front and rear at a distance of 1 meter. 60 db and 66 db noise measures were taken from front and rear respectively.

To apprise the public of the scope of this invention, the following claims are made:

What is claimed is:

1. A fan module for use in an electronic enclosure, the fan module comprising:
   a housing;
   an air intake panel provided in a first side of the housing;
   an exhaust panel provided in a second side of the housing;
   a plurality of fans, the plurality of fans being successively spaced along a first Cartesian coordinate to allow a portion of the airflow from each fan to flow through each successive fan and a portion of the airflow from each fan to flow around each successive fan and staggered in at least one of a second and third Cartesian coordinate.

2. The fan module as defined in claim 1, wherein each of the fans in the plurality of fans is angled to direct the air flow from the air intake panel to the exhaust panel.

3. The fan module as defined in claim 1, wherein the exhaust panel comprises a honeycomb structure, the cells of the honeycomb being sized and dimensioned to provide a wave guide for electromagnetic interference.

4. The fan module as defined in claim 1, wherein at least two of the plurality of fans is directed at and draws air through the intake panel.

5. The fan module as defined in claim 1, wherein the air intake panel is positioned in the housing at a ninety degree angle to the exhaust panel.

6. The fan module as defined in claim 1, wherein the air intake panel is provided in a bottom panel of the housing.

7. The fan module as defined in claim 5, wherein the exhaust panel is provided in a side of the housing, the side of the housing being provided at a ninety degree angle to the bottom panel of the housing.

8. The fan module as defined in claim 1, wherein a first of the plurality of fans is staggered with respect to a second of the plurality of fans to provide a portion of the first of the plurality of fans that overly a portion of the second plurality of fans, and a portion of the first of the plurality of fans that does not overly any portion of the second of the plurality of fans.

9. A fan module for use in an electronic enclosure, the fan module comprising:
- a housing including an air intake panel provided in a first portion of the housing;
- an exhaust panel provided in a second portion of the housing, the second portion of the housing being located at an angle of at least ninety degrees to the first portion;
- a plurality of fans, the plurality of fans being successively spaced along a first Cartesian coordinate and staggered in at least one of a second and third Cartesian coordinate, each of the fans being angled to direct air from the air intake panel to the exhaust panel.

10. The fan module as defined in claim 9, wherein the air intake panel is defined in a bottom of the housing and the exhaust panel is defined in a side of the housing perpendicular to the bottom of the housing.

11. The fan module as defined in claim 9, wherein the plurality of fans are staggered in each of a second and a third Cartesian coordinate.

12. The fan module as defined in claim 9, wherein a first of the plurality of fans is staggered with respect to a second of the plurality of fans to provide a portion of the first of the plurality of fans that overly a portion of the second plurality of fans, and a portion of the first of the plurality of fans that does not overly any portion of the second of the plurality of fans.

13. An electronic enclosure, comprising:
- a circuit card cage;
- a fan module positioned above the circuit card cage, the fan module including an air intake directed at the circuit card cage and an exhaust plate provided adjacent an open area; and
- a second air intake provided beneath the circuit card cage;
- wherein a plurality of fans are located in the fan module, each of the fans being offset from another of the plurality of fans in at least one Cartesian coordinate and being angled to direct air flow from the air intake to the exhaust plate.

14. The electronic enclosure as defined in claim 13, wherein at least one of the corners of the circuit card cage is provided with a bend radius greater than ninety degrees.

15. The electronic enclosure as defined in claim 13 wherein each of the corners in the enclosure at which air flows is provided with a bend radius of greater than ninety degrees.

16. The electronic enclosure as defined in claim 15, wherein the bend radius is provided by an involute coupled to a corner of the circuit card cage.

17. The electronic enclosure as defined in claim 13, wherein the exhaust plate comprises a structure having an open air to structure ratio of at least ninety percent.

18. The electronic enclosure as defined in claim 13, wherein at least one of the plurality of fans is staggered with resect to another of the plurality of fans such that a portion of the one of the plurality of fans overlaps a portion of the other of the plurality of fans.

19. The electronic enclosure as defined in claim 18 wherein a portion of the one of the plurality of fans does not overlap any portion of the other of the plurality of fans.

* * * * *

UNITED STATES PATENT AND TRADEMARK OFFICE
CERTIFICATE OF CORRECTION

PATENT NO. : 6,813,152 B2
DATED : November 2, 2004
INVENTOR(S) : Thomas M. Perazzo

It is certified that error appears in the above-identified patent and that said Letters Patent is hereby corrected as shown below:

Column 3,
Line 19, "filly" should be -- fully --.

Column 6,
Lines 49-54, " … spaced along a first Cartesian coordinate to allow a portion of the airflow from each fan to flow through each successive fan and a portion of the airflow from each fan to flow around each successive fan and staggered in at least one of a second and third Cartesian coordinate." should be -- spaced along a first Cartesian coordinate and staggered in at least one of a second and third Cartesian coordinate to allow a portion of the airflow from each fan to flow through each successive fan and a portion of the airflow from each fan to flow around each successive fan. --

Signed and Sealed this

Twenty-second Day of February, 2005

JON W. DUDAS
*Director of the United States Patent and Trademark Office*